(12) United States Patent
Shinkawata

(10) Patent No.: US 6,593,609 B2
(45) Date of Patent: Jul. 15, 2003

(54) SEMICONDUCTOR MEMORY DEVICE

(75) Inventor: Hiroki Shinkawata, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/995,836

(22) Filed: Nov. 29, 2001

(65) Prior Publication Data

US 2002/0158280 A1 Oct. 31, 2002

(30) Foreign Application Priority Data

Apr. 25, 2001 (JP) ........................................ 2001-127904

(51) Int. Cl.[7] ............................................. H01L 27/108
(52) U.S. Cl. ...................... 257/296; 257/298; 257/300; 257/326; 257/384; 257/412
(58) Field of Search ........................... 257/71, 296, 256, 257/384, 412, 791, 306, 298, 300, 326; 438/650, 651, 657, 241, 238, 239, 258

(56) References Cited

U.S. PATENT DOCUMENTS

| 5,998,252 | A | * | 12/1999 | Huang ......................... 438/396 |
| 6,025,620 | A | * | 2/2000 | Kimura et al. ............... 257/296 |
| 6,177,306 | B1 | * | 1/2001 | Wu .............................. 438/241 |
| 6,287,911 | B1 | * | 9/2001 | Nobusawa ................... 438/241 |
| 6,417,534 | B2 | * | 7/2002 | Nakahata et al. ........... 257/306 |

FOREIGN PATENT DOCUMENTS

| JP | 2000-196017 | 7/2000 |
| JP | 2000-269461 | 9/2000 |

OTHER PUBLICATIONS

Syd R. Wilson, Clarence J. Tracy, and John L. Freeman, Jr., "Handbook of Multilevel Metallization for Integrated Circuits," Noyes Publ., Westwood, New Jersey, (1993), pp. 43–44.*

* cited by examiner

Primary Examiner—Tom Thomas
Assistant Examiner—Thomas Magee
(74) Attorney, Agent, or Firm—McDermott, Will & Emery

(57) ABSTRACT

The present invention provides a semiconductor memory device in which a first insulation film and a second insulation film are laminated on a source and a drain of an access transistor to form a laminated insulation film, wherein the first insulation film is the same as an insulation film used as a sidewall for a logic transistor, and the second insulation film is the same as an encircling insulation film encircling the sidewall. Furthermore, the top surface of the laminated insulation film is positioned at substantially the same height as that of a silicide film on a gate electrode of the access transistor. On the other hand, a method for fabricating a semiconductor memory device according to the present invention polishes a logic region and a memory cell region together so as to expose gate electrodes of a logic transistor and an access transistor, and further polishes a laminated insulation film on a source and a drain of the access transistor.

4 Claims, 18 Drawing Sheets

SEMICONDUCTOR MEMORY DEVICE

BACKGROUND OF THE INVENTION

1. Field of the Invention

The present invention relates to a semiconductor memory device such as a DRAM, whose memory cell region includes a plurality of access transistors and memory capacitors connected to the drains of the access transistors and whose logic region includes a plurality of logic transistors. The present invention also relates to a method for fabricating the above semiconductor memory device.

2. Background Art

In a memory device having a memory cell region and a logic region, the logic transistors in the logic region have a silicide film formed on their sources and drains to lower the resistance of the source and the drain circuits. In addition, a silicide film is further formed on the gate electrodes of the logic transistor so that a "salicide" configuration is established to lower the resistance of the gate circuits. On the other hand, if a silicide film is formed on the sources and the drains of the access transistors in the memory cell region, the leakage currents of the sources and the drains increase, deteriorating the DRAM refresh performance. Therefore, it is not possible to apply a "salicide" configuration to the access transistors in the memory cell region. However, since it is strongly desired to reduce the resistance of the gate electrodes of the access transistors, it is preferred to apply a silicide technique only to the gate electrodes leaving the sources and the drains as they are.

To address such a need, for example, Japanese Patent Laid-Open No. 2000-269461 discloses a technique in which the distances between the access transistors in the memory region are reduced to bury the drains under an insulation film, and a silicide film is formed on the gate electrodes of the access transistors. However, since the sources of the access transistors to which bit lines are connected have a large area, they cannot be buried under the insulation film when the silicide film is formed. This means that the problem of the leakage currents flowing from the sources of the access transistors is left unsolved.

SUMMARY OF THE INVENTION

The present invention provides an improved semiconductor memory device in which a silicide film can be formed on the gate electrodes of the access transistors in a state that the sources and the drains of the access transistors have an insulation film of a sufficient thickness formed thereon regardless of their areas.

The present invention also provides an improved semiconductor memory device in which a silicide film can be formed on the gate electrodes of the access transistors in a state that the sources and the drains of the access transistors have an insulation film of a sufficient thickness formed thereon regardless of their areas, without making the fabrication process complicated.

According to one aspect of the present invention, a semiconductor device comprises a plurality of access transistors and memory capacitors connected to drains of the plurality of access transistors in a memory cell region a plurality of logic transistors in a logic region. The each logic transistor includes a first silicide film on a source and a drain, a gate electrode on a gate insulation film, a second silicide film on the gate electrode, a sidewall for the gate electrode, and an encircling insulation film encircling the sidewall. The each access transistor includes a gate electrode on a gate insulation film, a third silicide film on the gate electrode, and a laminated insulation film on a source and a drain of the each access transistor. The laminated insulation film is composed of a first film and a second film laminated on the first film and a top surface. The laminated insulation film is positioned at substantially the same height as that of the third silicide film. The first film is the same insulation film as that used as the sidewall of the each logic transistor and the second film is the same insulation film as that used as the encircling insulation film.

According to another aspect of the present invention, in the semiconductor memory device, the second silicide film and the third silicide film are made of a same material but the first silicide film is made of a different material.

According to another aspect of the present invention, the semiconductor memory device further comprises a bitline plug contact connected to the source (or the drain) of the each access transistor and a capacitor plug contact connected to the drain (or the source) of the each access transistor. The bit-line plug contact and the capacitor plug contact are formed through the laminated insulation film. The bit-line plug contact and the capacitor plug contact each have a fourth silicide film thereon, and a bit line and a memory capacitor are each connected to a respective fourth silicide film.

According to another aspect of the present invention, in the semiconductor memory device, the second silicide film, the third silicide film, and the fourth silicide film are made of a same material but the first silicide film is made of a different material.

According to another aspect of the present invention, in a method for fabricating a semiconductor memory device which includes a plurality of access transistors and memory capacitors connected to drains of the plurality of access transistors in a memory cell region, and a plurality of logic transistors in a logic region, a gate electrode is formed on a gate insulation film of each logic transistor and on a gate insulation film of each access transistor. An insulation film is coated on the gate electrode of the each logic transistor to form a sidewall for the gate electrode and on a source and a drain of each access transistor. A first silicide film is formed on a source and a drain of the each logic transistor. An insulation film is coated around the sidewall of the each logic transistor and is laminated on the source and the drain of the each access transistor so as to form a laminated insulation film. The logic region and the memory cell region are together polished so as to expose the gate electrode of the each logic transistor and the gate electrode of the each access transistor. The laminated insulation film on the source and the drain of the each access transistor are polished. A second silicide film and a third silicide film are formed on the gate electrode of the each logic transistor and on the gate electrode of the access transistor, respectively.

According to another aspect of the present invention, in the method for fabricating a semiconductor memory device, the second silicide film and the third silicide film are formed by using a material different from that of the first silicide film.

According to another aspect of the present invention, in the method for fabricating a semiconductor memory device, through the laminated insulation film, a bit-line plug contact connected to the source (or the drain) of the each access transistor is formed, and a capacitor plug contact connected to the drain (or the source) of the each access transistor is formed. When the logic region and the memory cell region are polished together, the bit-line plug contact and the capacitor plug contact are also polished. When the second silicide film and the third silicide film are each formed on a respective gate electrode, a fourth silicide film is formed on the bit-line plug contact and the capacitor plug contact.

Other and further objects, features and advantages of the invention will appear more fully from the following description.

DETAILED DESCRIPTION OF THE PREFERRED EMBODIMENTS

First Embodiment

FIGS. 1 through 12 show a semiconductor memory device according to a first embodiment of the present invention, each figure indicating a step performed in the fabrication process. This semiconductor memory device is composed of a memory cell region 100 and a logic region 200. In each figure, a region A at the left-hand side and a region B at the right-hand side indicate the memory cell region 100 and the logic region 200, respectively. Even though the memory cell region 100 actually includes a plurality of access transistors and a plurality of memory capacitors, each figure shows only a portion including a pair of access transistors and two memory capacitors as a representative portion. Furthermore, even though the logic region 200 actually includes a plurality of logic transistors which control the memory cell region 100, each figure shows only one logic transistor as a representative logic transistor.

Figure 1:
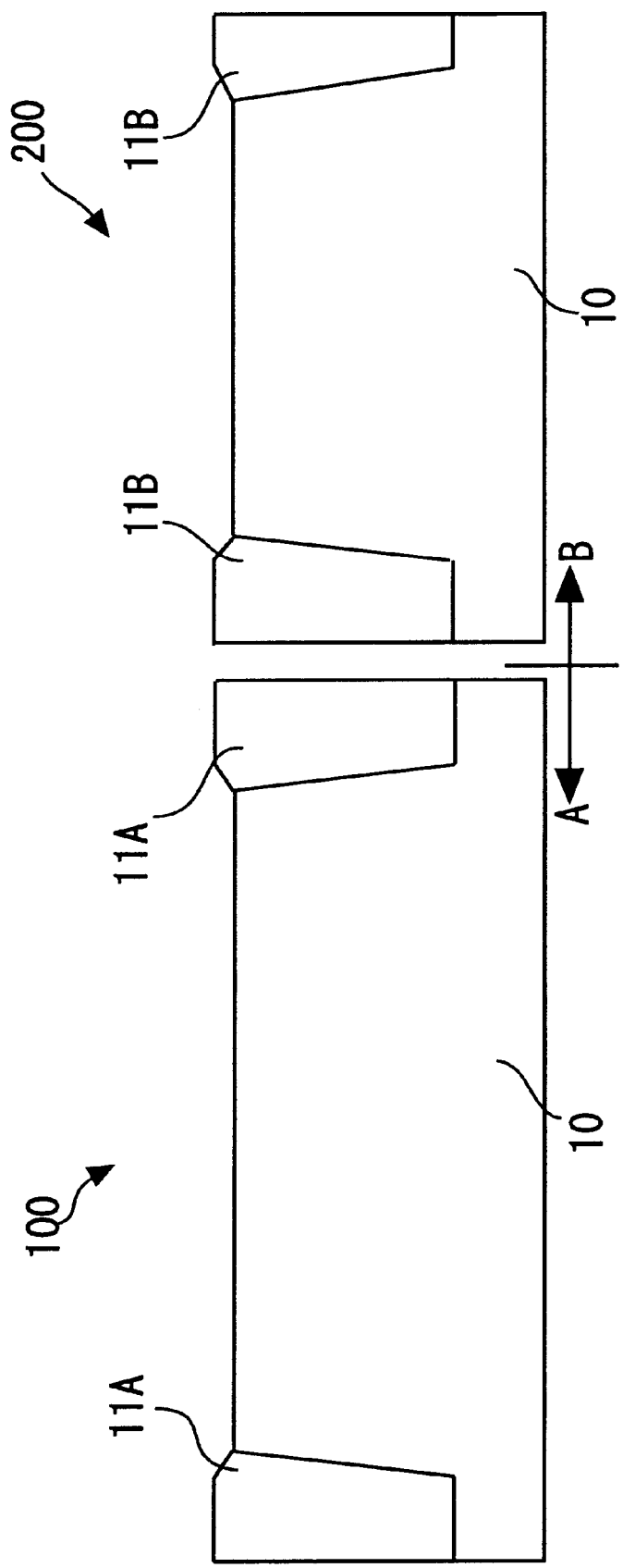
FIG. 1 is a sectional view of a semiconductor memory device in a first fabrication process according to a first embodiment of the present invention.

FIG. 1 shows a first process which prepares a silicon semiconductor substrate 10 having separation oxide films 11A and 11B formed on its front main surface to separate the device portions. The separation oxide film 11A encircles a portion which forms a pair of access transistors representing the memory cell region 100, while the separation oxide film 11B encircles a portion which forms a logic transistor representing the logic region 200.

Figure 2:
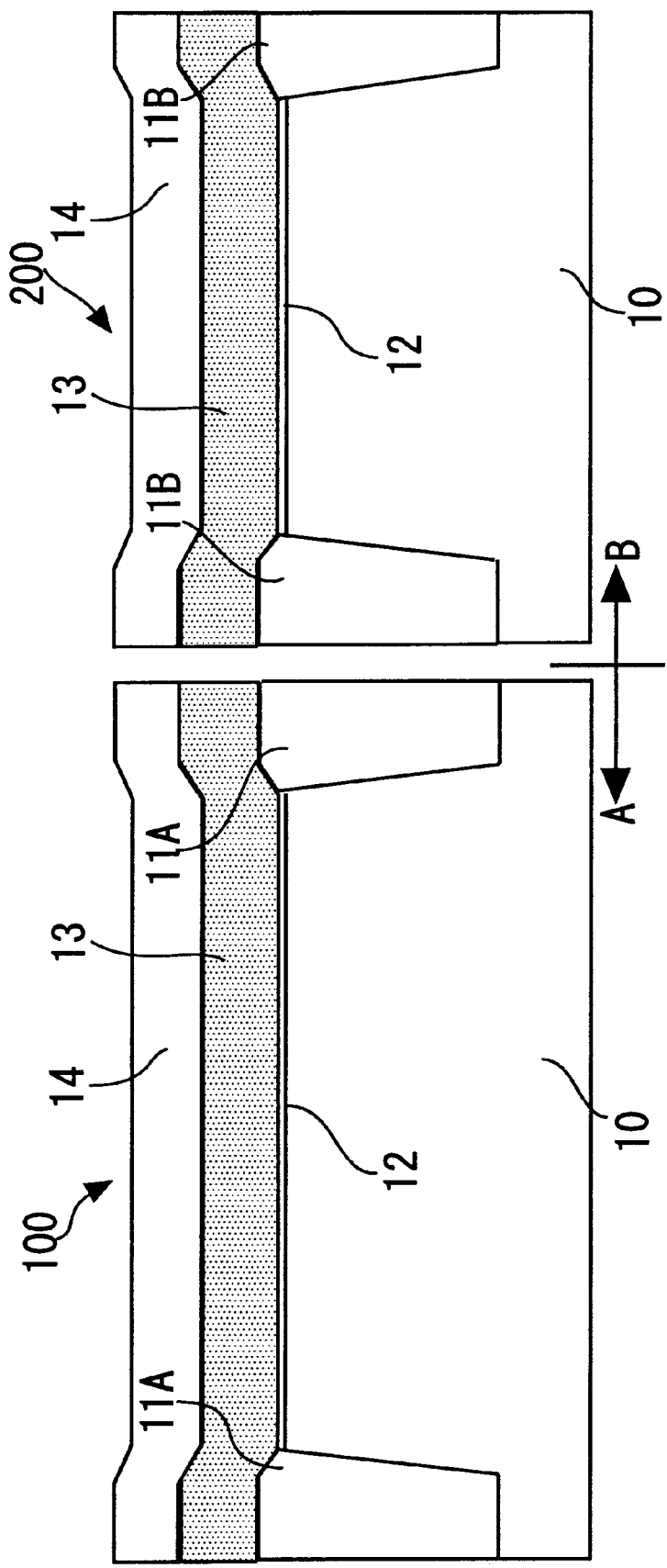
FIG. 2 is a sectional view of a semiconductor memory device in a second fabrication process according to the first embodiment of the present invention.

FIG. 2 shows a second process in which a silicon oxide film 12, a polysilicon film 13, a TEOS silicon oxide film 14 are formed on the silicon substrate 10 in that order. These films 12, 13, and 14 are formed on both the memory cell region 100 and the logic region 200 commonly. The silicon oxide film 12 is processed to form the gate insulation films for both the access transistors in the memory cell region 100 and the logic transistors in the logic region 200. The polysilicon film 13 is processed to form the gate electrodes for the access transistors and the logic transistors. A polysilicon film doped with impurities is used as the polysilicon film 13.

Figure 3:
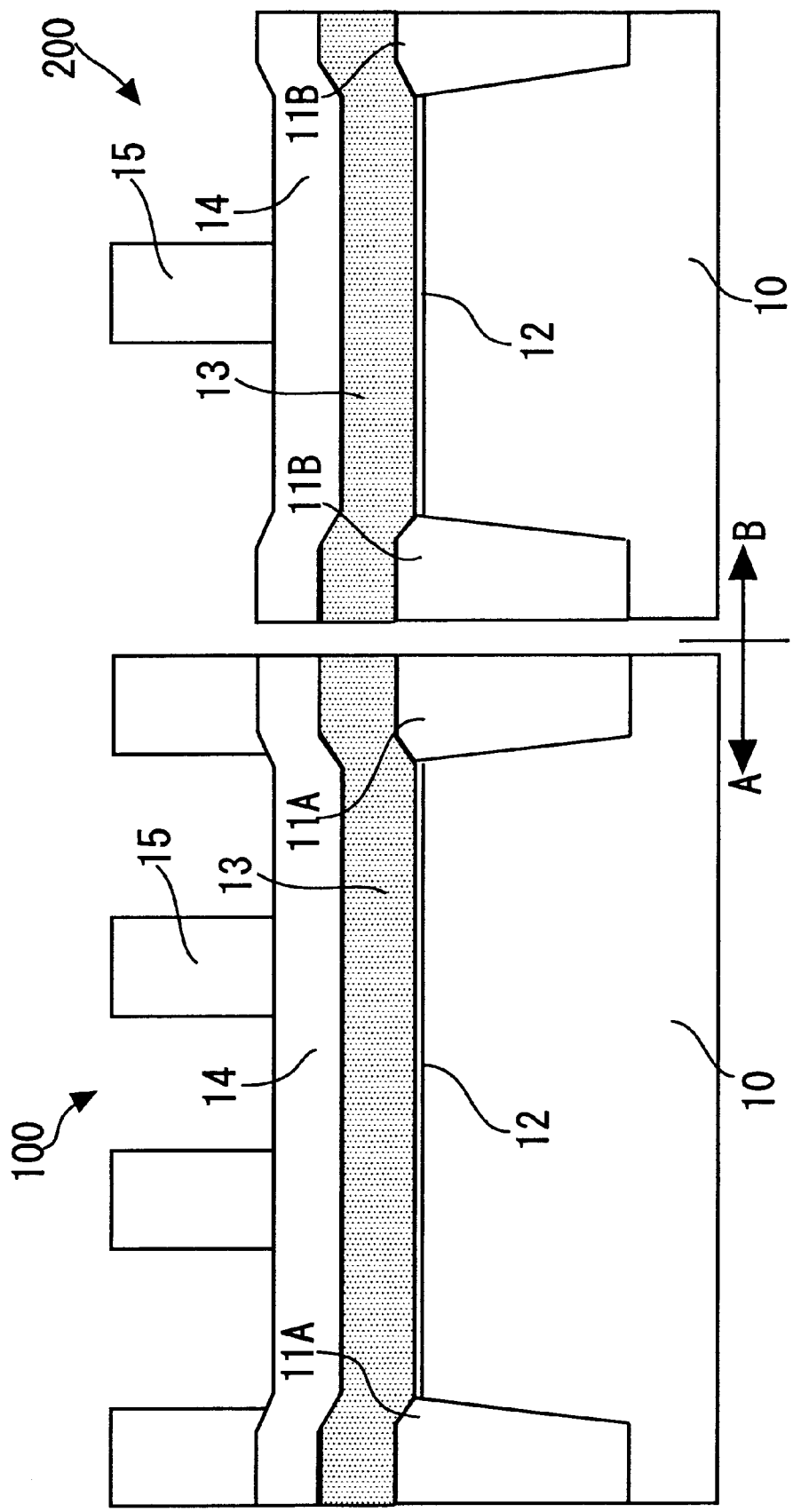
FIG. 3 is a sectional view of a semiconductor memory device in a third fabrication process according to the first embodiment of the present invention.

FIG. 3 shows a third process in which a resist pattern 15 is formed on the TEOS silicon oxide film 14. This resist pattern 15 is used to form the gate electrodes for the access transistors and the logic transistors. This resist pattern is patterned so that it covers the portions of the polysilicon film 13 which are to form the gate electrodes and the portions of the polysilicon film 13 over the separation insulation film 11A.

Figure 4:
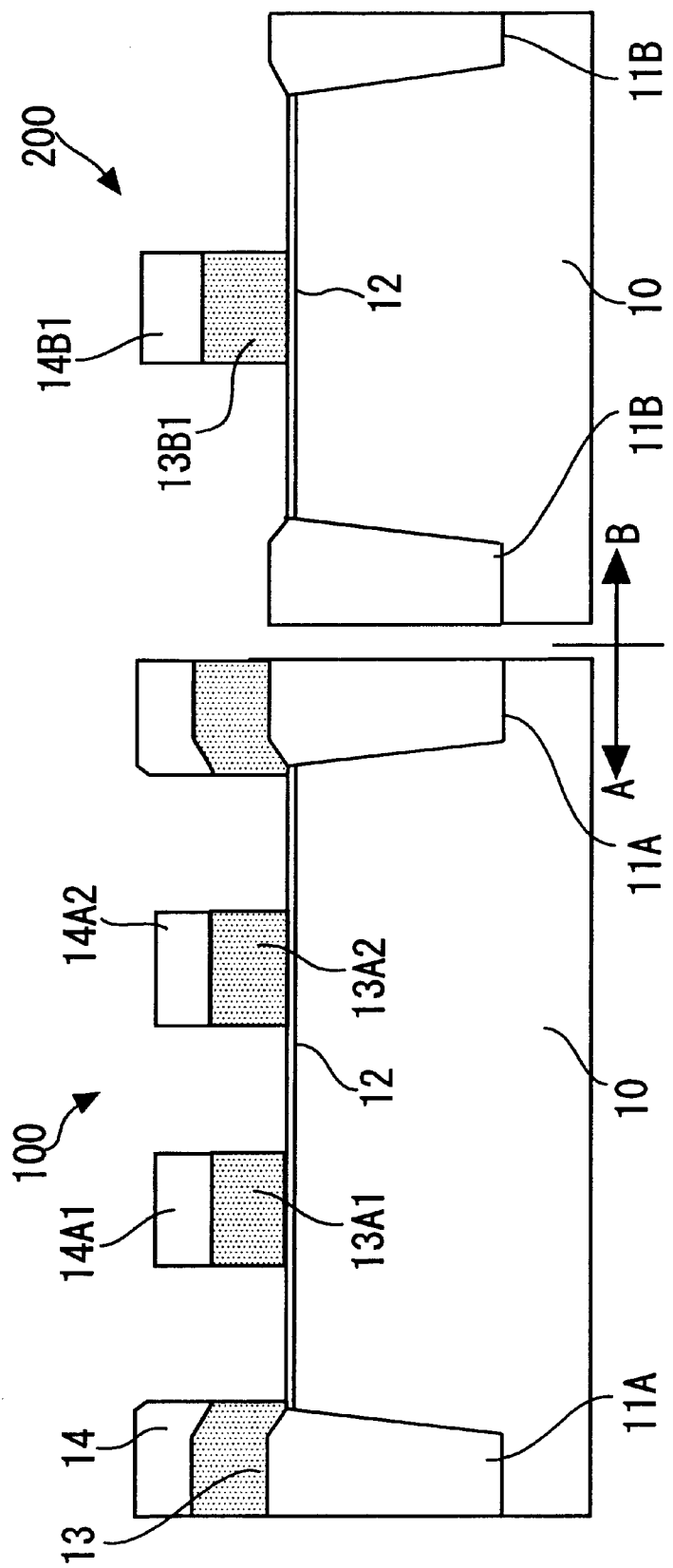
FIG. 4 is a sectional view of a semiconductor memory device in a fourth fabrication process according to the first embodiment of the present invention.

FIG. 4 shows a fourth process. In the fourth process, the resist pattern 15 is used to etch the TEOS silicon oxide film 14 and the polysilicon film 13. The silicon oxide film 12 is not etched. In the fourth process, the polysilicon film 13 is patterned after the TEOS silicon oxide film 14 to form gate electrodes 13A1 and 13A2 of the access transistors and gate electrode 13B1 of the logic transistor. The TEOS insulation film 14 is also patterned to produce TEOS insulation films 14A1 and 14A2 on the gate electrodes 13A1 and 13A2, respectively, and a TEOS insulation film 14B1 on the gate electrode 13B1. It should be noted that even though the polysilicon film 13 on the separation insulation film 11B is removed, the polysilicon film 13 and the TEOS silicon oxide film 14 on the separation insulation film 11A are not removed. FIG. 4 shows a state in which the resist pattern 15 has already been removed.

Figure 5:
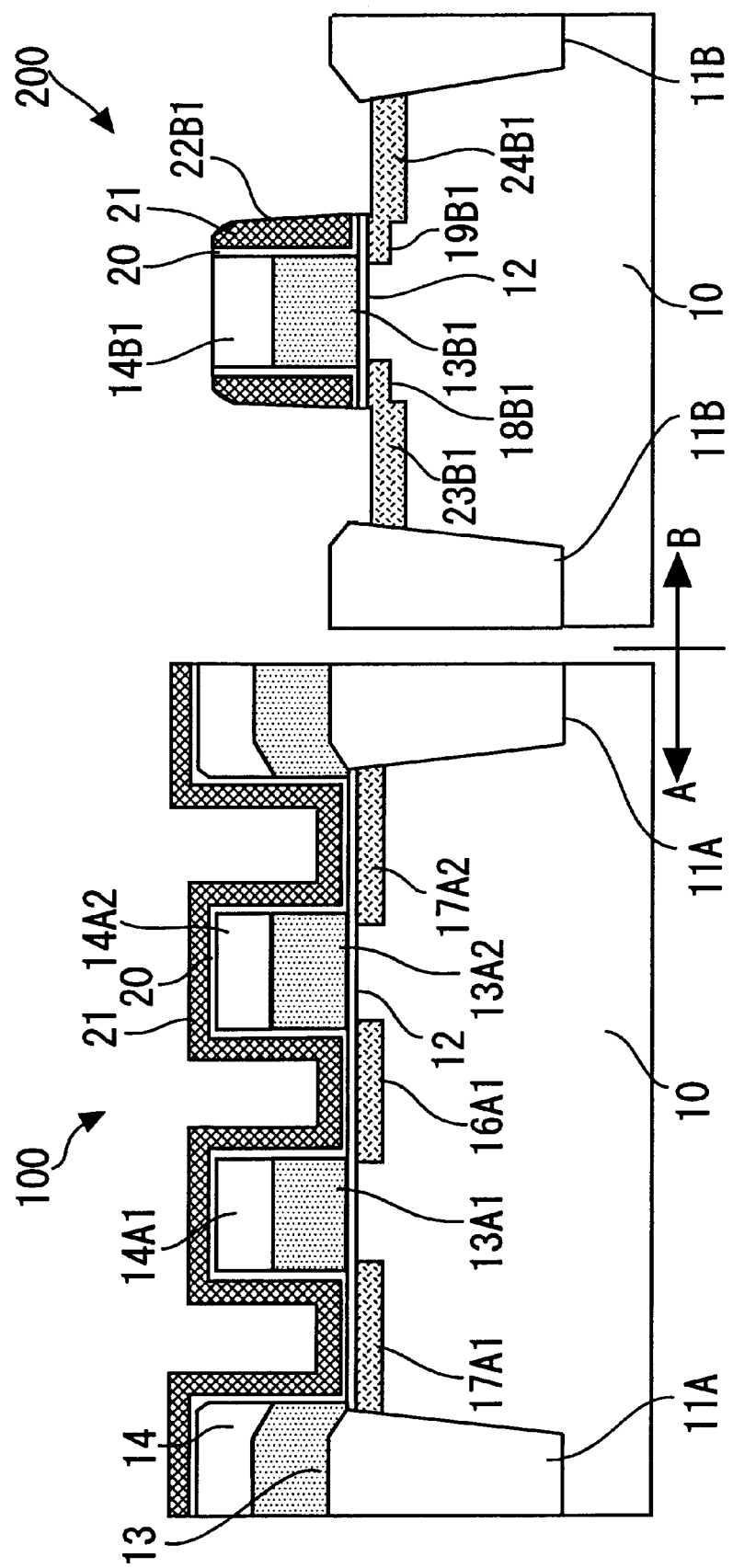
FIG. 5 is a sectional view of a semiconductor memory device in a fifth fabrication process according to the first embodiment of the present invention.

FIG. 5 shows a fifth process. In the fifth process, the patterned TEOS silicon oxide films 14A1 and 14A2, the patterned gate electrodes 13A1 and 13A2, and the TEOS silicon oxide film 14 and the polysilicon film 13 left on the separation insulation film 11A are used as masks in the memory cell region 100 to ion-implant low concentration impurities into the silicon substrate 10 through the silicon oxide film 12. Therefore, a source 16A1 and drains 17A1 and 17A2 of each access transistor are formed. At that time, the patterned TEOS silicon oxide film 14B1, the patterned gate electrode 13B1, and the separation insulation film 11B are used as masks in the logic region 200 to ion-implant low concentration impurities into the silicon substrate 10 through the silicon oxide film 12. Therefore, a shallow source 18B1 and a shallow drain 19B1 of the logic transistor are formed. Subsequently, a TEOS silicon oxide film 20 and a silicon nitride film 21 are formed. In the logic region 200, the TEOS silicon oxide film 20 and the silicon nitride film 21 are coated around the gate electrode 13B1 of the logic transistor and the TEOS silicon oxide film 14B1 on the gate electrode 13B1. In the memory cell region 100, on the other hand, the TEOS silicon oxide film 20 and the silicon nitride film 21 are coated on the portion between the gate electrodes 13A1 and 13A2 over the source 16A1 of the access transistors and on the portions between the gate electrodes 13A1 and 13A2 and the polysilicon film 13 on the separation insulation film 11A over the drains 17A1 and 17A2 of the access transistors. The TEOS silicon oxide film 20 and the silicon nitride film 21 are also coated so as to enclose the gate electrodes 13A1 and 13A2 and the TEOS silicon oxide films 14A1 and 14A2 on the gate electrodes 13A1 and 13A2.

Subsequently, in the logic region 200, the TEOS silicon oxide film 20 and the silicon nitride film 21 are anisotropically etched to form an LDD spacer 22B1 constituting the sidewall for the gate electrode 13B1 of the logic transistor. Then, by using the LDD spacer 22B1 as a mask, the silicon oxide film 12 on both side of the LDD spacer 22B1 is selectively etched to form a deep source 23B1 and a deep drain 24B1 of the logic transistor by additional ion implantation.

Figure 6:
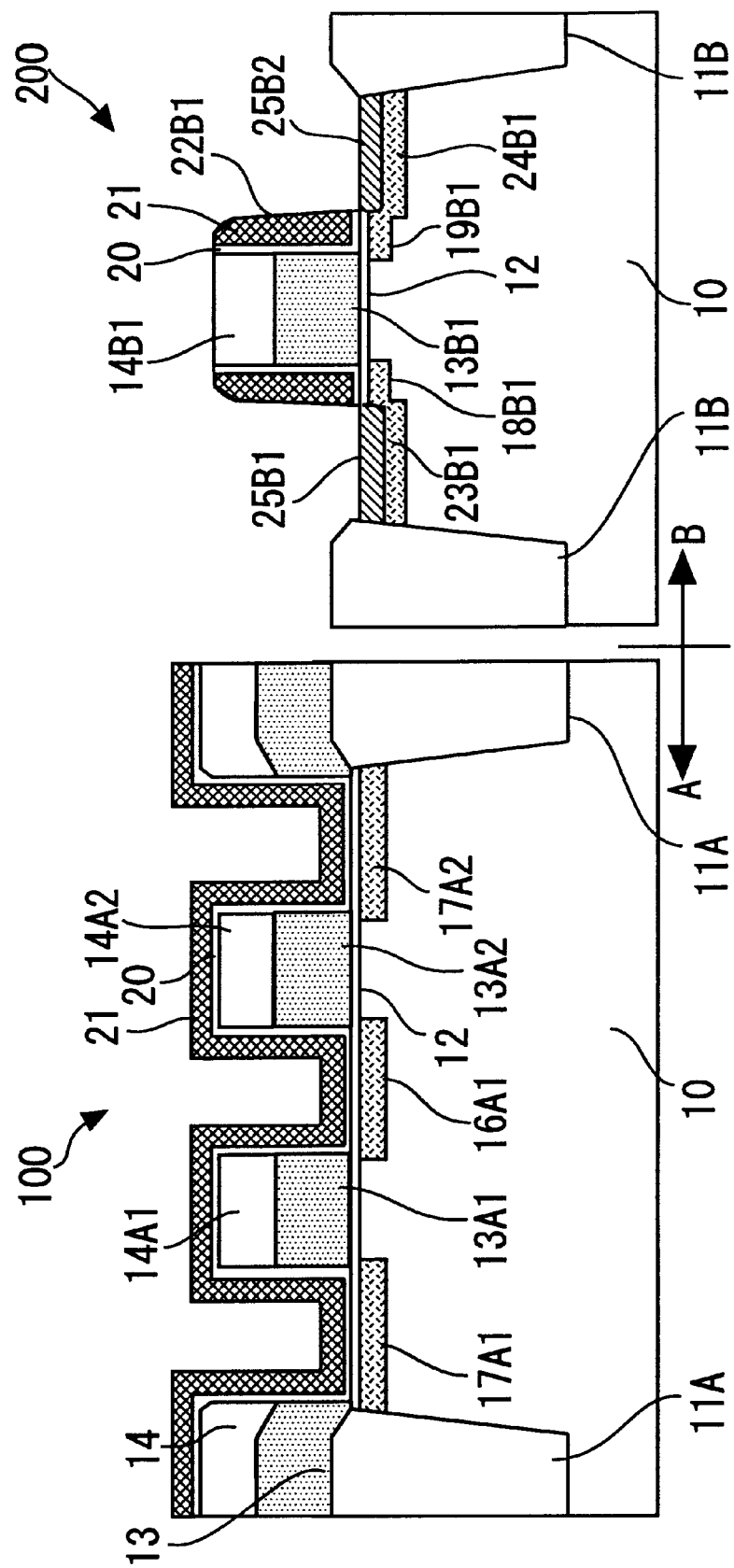
FIG. 6 is a sectional view of a semiconductor memory device in a sixth fabrication process according to the first embodiment of the present invention.

FIG. 6 shows a sixth process. In the sixth process, first silicide films 25B1 and 25B2 are formed on the surface of the deep source 23B1 and the deep drain 24B1 of the logic transistor, respectively. The first silicide films 25B1 and 25B2 are metal silicide films selected from a group of materials including $CoSi_2$, $TiSi_2$, $NiSi_2$, PdSi, ZrSi, HfSi, PtSi, CuSi, AlSi, and AgSi. The first silicide films 25B1 and 25B2 are formed by heat processing after metals constituting these metal silicide films are coated on the entire front surface of the silicon substrate 10. No silicide film is formed on portions other than the source 23B1, the drain 24B1 and TEOS silicon oxide film 14B1 since they are covered with the insulation film.

Figure 7:
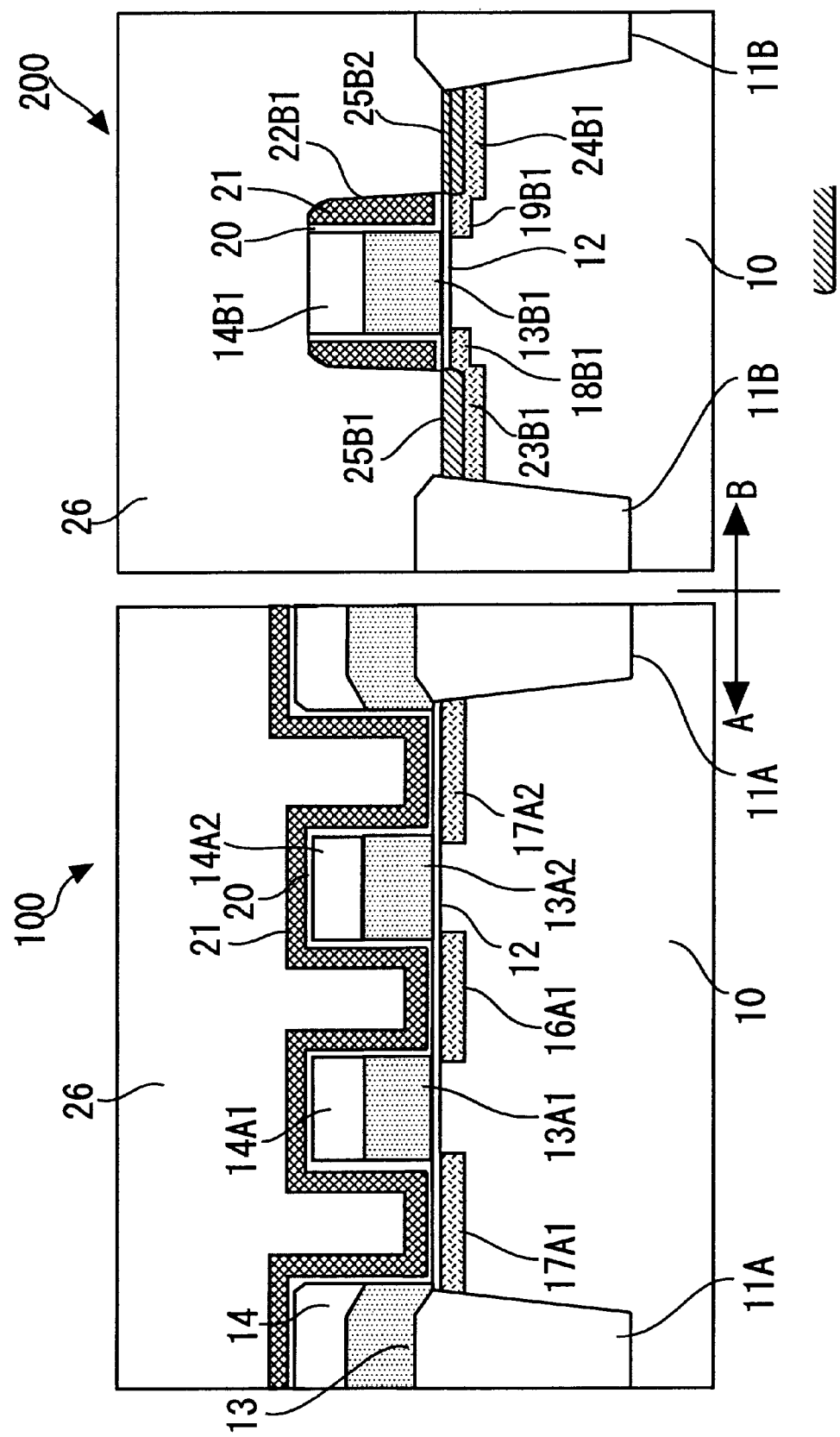
FIG. 7 is a sectional view of a semiconductor memory device in a seventh fabrication process according to the first embodiment of the present invention.

FIG. 7 shows a seventh process. In the seventh process, a first interlayer insulation film 26 coats on the entire front surface of the silicon substrate 10. In the memory cell region 100, the interlayer insulation film 26 forms a laminated insulation film laminating on the TEOS silicon oxide film 20 and the silicon nitride film 21 over the source 16A1 and the drains 17A1 and 17A2 of the access transistor. In the logic region 200, on the other hand, the first interlayer insulation film 26 forms an encircling insulation film encircling the LDD spacer 22B1 of the logic transistor.

Figure 8:
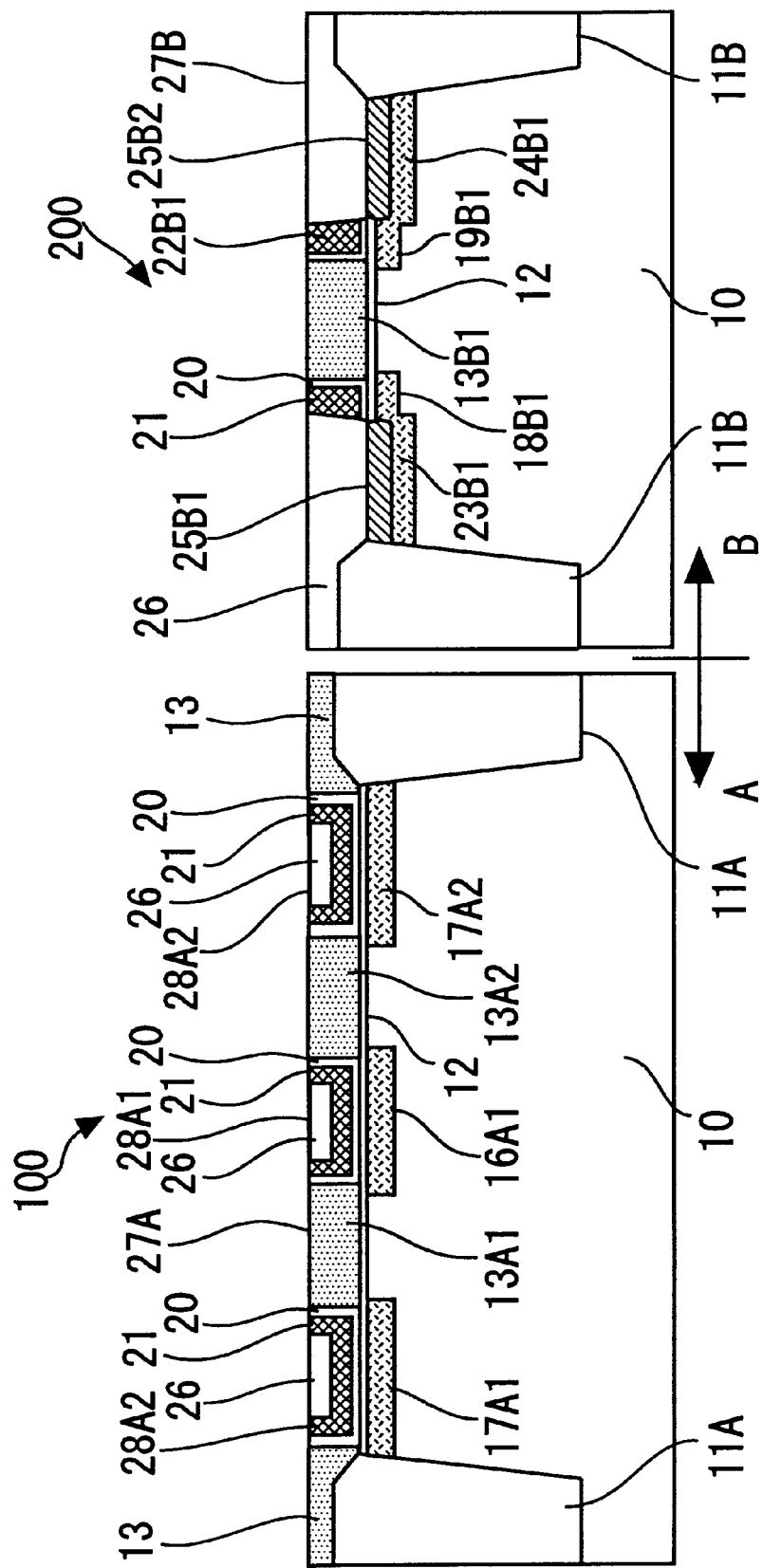
FIG. 8 is a sectional view of a semiconductor memory device in an eighth fabrication process according to the first embodiment of the present invention.

FIG. 8 shows an eighth process. In the eighth process, the entire front surface of the silicon substrate 10 is polished by, for example, chemical mechanical polishing (CMP). Thus, polished surfaces 27A and 27B are formed for the memory cell region 100 and the logic region 200, respectively. Specifically, this process polishes the first interlayer insulation film 26, the TEOS silicon oxide film 20, the silicon nitride film 21, and the TEOS silicon oxide films 14A1, 14A2, and 14B1 until the surfaces of the gate electrodes 13A1 and 13A2 of the access transistors in the memory cell region 100 and the gate electrode 13B1 of the logic transistor in the logic region 200 become exposed. As a result of this polishing, the gate electrodes 13A1 and 13A2 of the access transistors are exposed on the polished surface 27A in the memory cell region 100. Furthermore, a laminated insulation film 28A1 is formed over the source 16A1, while a laminated insulation films 28A2 are formed over the drains 17A1 and 17A2. The laminated insulation films 28A1 and 28A2 each have a three-layer structure made up of the TEOS silicon oxide film 20, the silicon nitride film 21, and the interlayer insulation film 26. The laminated insulation film 28A1 is located between the gate electrodes 13A1 and 13A2, while the laminated insulation films 28A2 are located both between the gate electrode 13A1 and the polysilicon film 13 on the separation insulation film 11A and between the gate electrode 13A2 and the polysilicon film 13 on the separation insulation film 11A.

Figure 9:
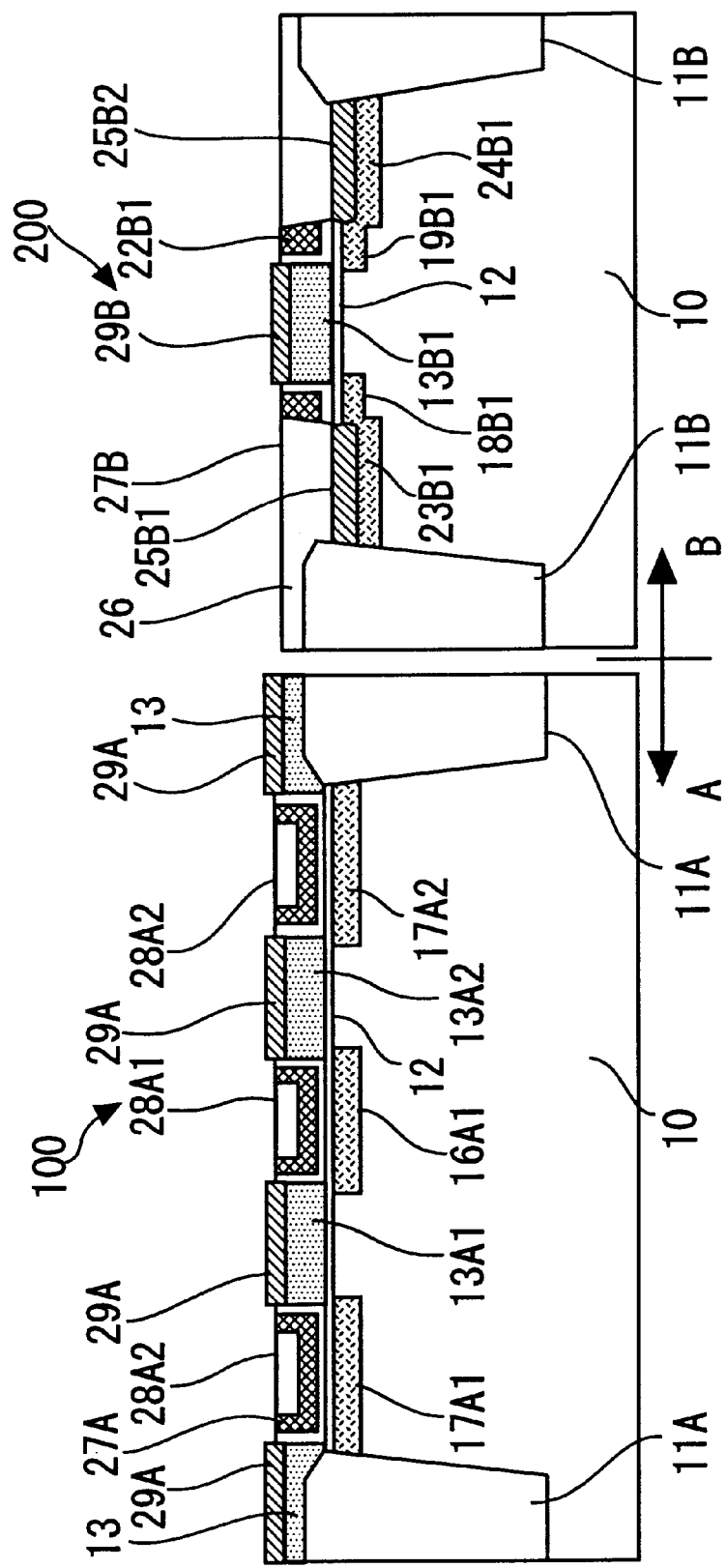
FIG. 9 is a sectional view of a semiconductor memory device in a ninth fabrication process according to the first embodiment of the present invention.

FIG. 9 shows a ninth process. In the ninth process, a second silicide film 29B is formed in the logic region 200 and a third silicide film 29A is formed in the memory cell region 100. The third silicide film 29A is formed on the gate electrodes 13A1 and 13A2 of the access transistor and the polysilicon film 13 over the separation insulation film 11A. The second silicide film 29B, on the other hand, is formed on the gate electrode 13B1 of the logic transistor. The silicide films 29A and 29B are formed at the same time by using the same metal silicide film selected from a group of materials including $CoSi_2$, $TiSi_2$, $NiSi_2$, PdSi, ZrSi, HfSi, PtSi, CuSi, AlSi, and AgSi. The silicide films 29A and 29B are formed at the same time by heat processing after metals constituting these metal silicide films are coated on the polished surface 27A in the memory cell region 100 and the polished surface 27B in the logic region 200.

The silicide films 29A and 29B are compounds of the above metals and the polysilicon constituting the gate electrodes 13A1, 13A2, and 13B1 and the polysilicon film 13 on the separation insulation film 11A. Naturally, the metals are also coated on the laminated insulation films 28A1 and 28A2 in the memory cell region 100 and the interlayer insulation film 26 in the logic region 200. However, since these laminated insulation films are insulators, the above metals form no silicides with them. Furthermore, the top surfaces of the laminated insulation films 28A1 and 28A2 are the polished surface 27A and are positioned at substantially the same height as that of the middle of the thickness of the third silicide film 29. Therefore insulation films 28A1 and 28A2 each have a sufficient thickness as the laminated a three-layer insulation film to prevent the metals constituting the above metal suicides from penetrating through the films 28A1, 28A2 and diffusing into the source 16A1 and the drains 17A1 and 17A2 in the silicon substrate 10.

The laminated insulation films 28A1 and 28A2 are formed over the source 16A1 and the drains 17A1 and 17A2, have substantially the same thickness as those of the gate electrodes 13A1 and 13A2, and thereby prevent the metals constituting the third silicide film 29A from penetrating through the laminated insulation films 28A1 and 28A2 and diffusing into the source 16A1 and the drains 17A1 and 17A2 in the silicon substrate 10 even if the source 16A1 and the drains 17A1 and 17A2 are large and furthermore the distance between the gate electrodes 13A1 and 13A2 are large and/or between the gate electrodes 13A1 and 13A2 and the polysilicon film 13 are large. As a result, there is no increase in leakage currents in PN junctions formed of the source 16A1 and the drains 17A1 and 17A2.

Figure 10:
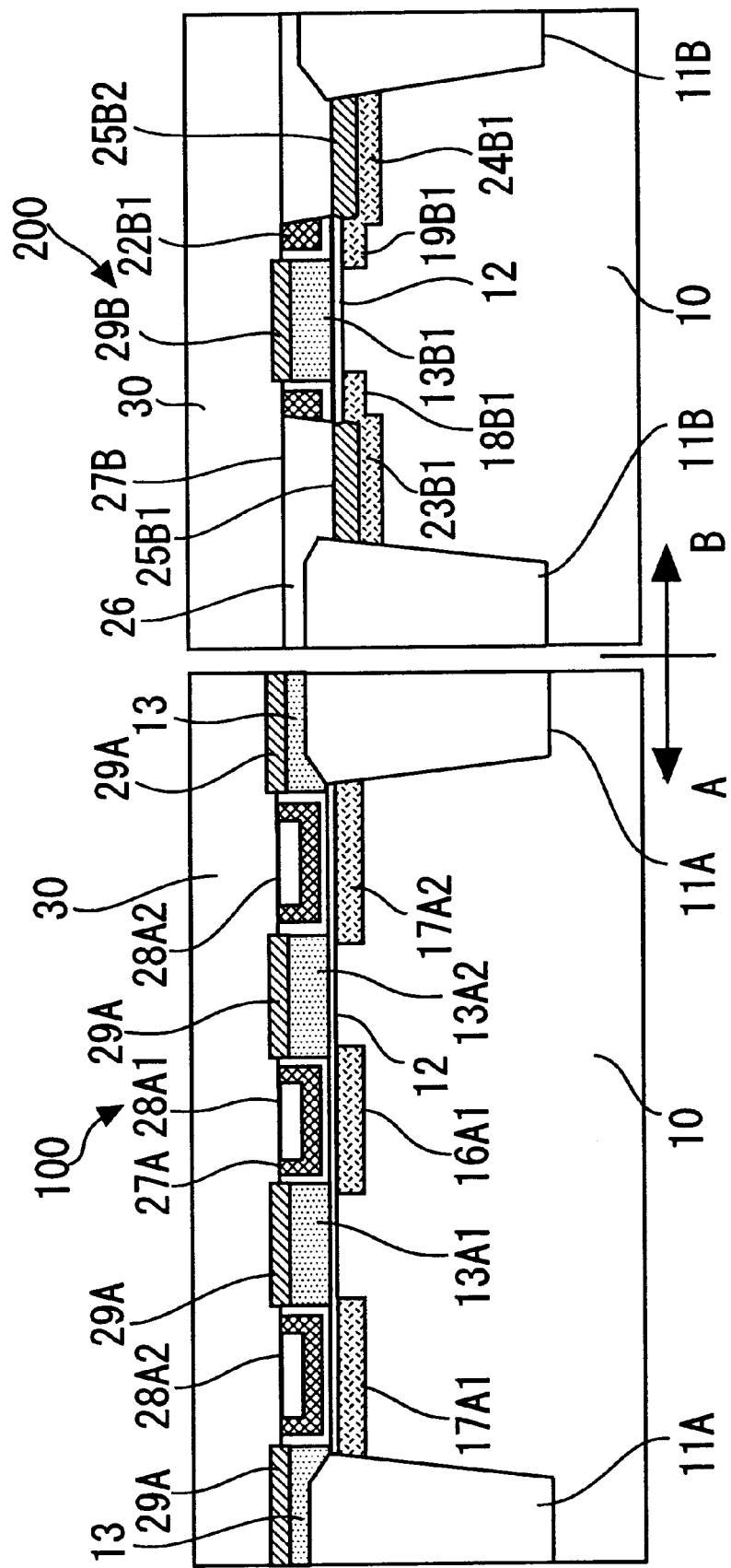
FIG. 10 is a sectional view of a semiconductor memory device in a tenth fabrication process according to the first embodiment of the present invention.

FIG. 10 shows a tenth process. In the tenth process, the entire front surface of the silicon substrate 10 is coated with a second interlayer insulation film 30. The interlayer insulation film 30 covers the third silicide film 29A and the laminated insulation films 28A1 and 28A2 in the memory cell region 100, while it covers the interlayer insulation film 26, the LDD spacer 22B1, and the second silicide film 29B in the logic region 200.

Figure 11:
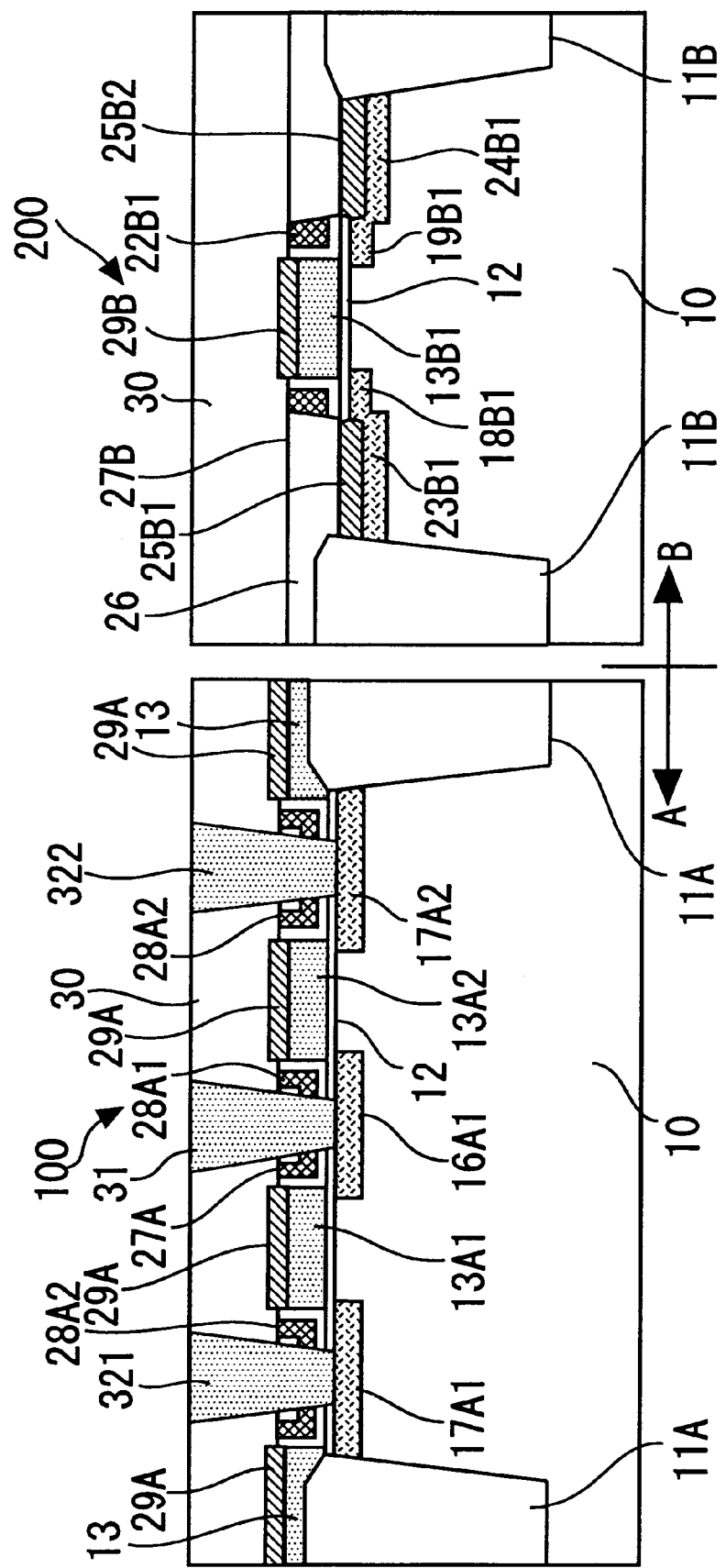
FIG. 11 is a sectional view of a semiconductor memory device in an eleventh fabrication process according to the first embodiment of the present invention.

FIG. 11 shows an eleventh process. In the eleventh process, a bit-line polysilicon plug contact 31 and capacitor polysilicon plug contacts 321 and 322 are formed in the memory cell region 100. The polysilicon plug contact 31 is connected to the source 16A1 through the interlayer insulation film 30, the laminated insulation film 28A1, and the silicon oxide film 12 under the laminated insulation film 28A1. The polysilicon plug contacts 321 and 322, on the other hand, are connected to the drains 17A1 and 17A2, respectively, through the interlayer insulation film 30, the laminated insulation film 28A2, and the silicon insulation film 12 under the laminated insulation film 28A2.

Figure 12:
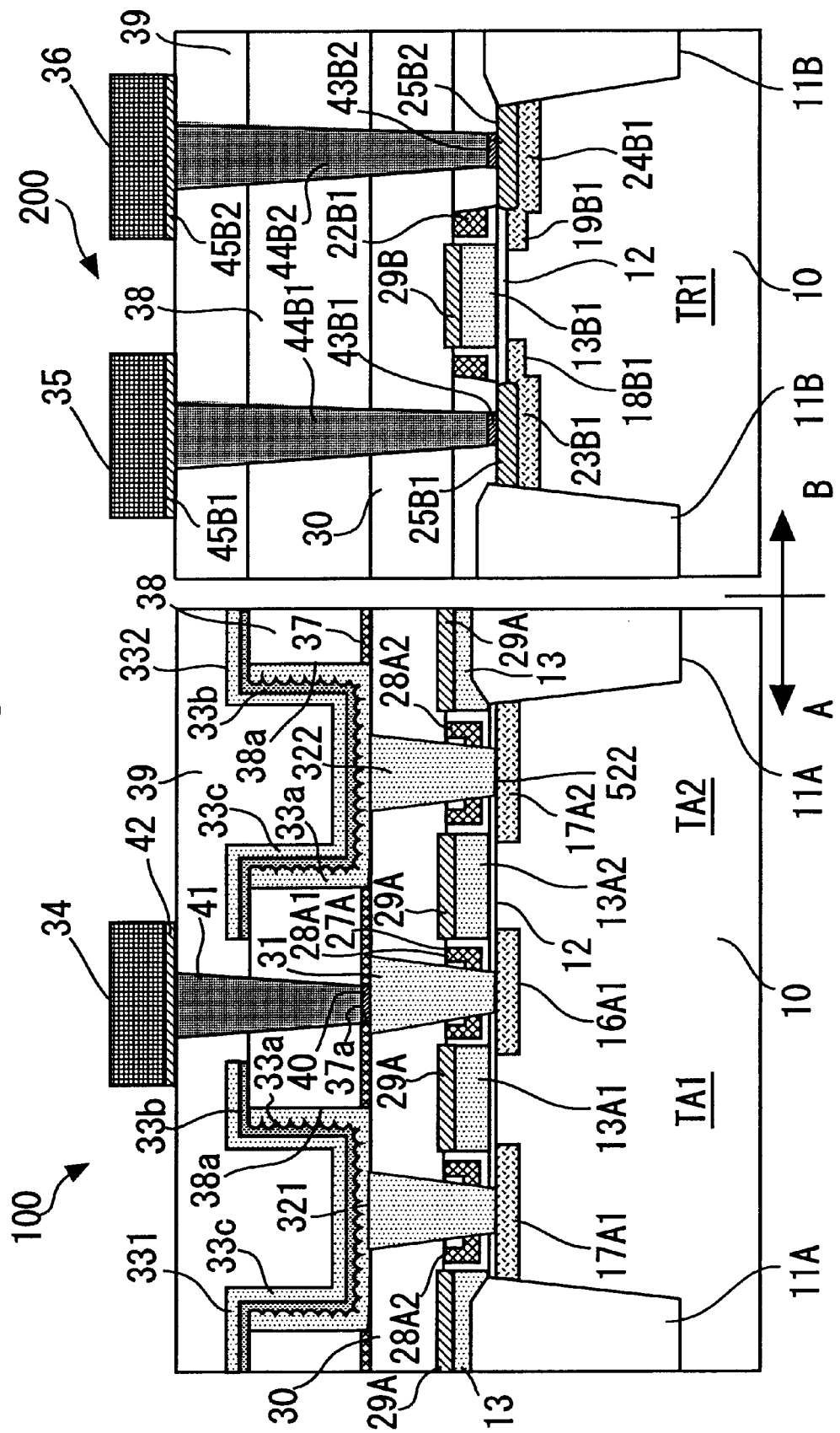
FIG. 12 is a sectional view of a semiconductor memory device in a twelfth fabrication process according to the first embodiment of the present invention.

FIG. 12 shows a twelfth process. In the twelfth process, memory capacitors 331 and 332 and bit lines 34, 35, and 36 are formed.

First, in the memory cell region 100, a silicon nitride film 37 to be used as an etching stopper is formed on the second interlayer insulation film 30. A third interlayer insulation film 38 is formed on the silicon nitride film 37. In the logic region 200, on the other hand, the third interlayer insulation film 38 is directly formed on the second interlayer insulation film 30. In the memory cell region 100, holes 38a are formed through the third interlayer insulation film 38 and the silicon nitride film 37, and tubular bottom electrodes 33a of the memory capacitors 331 and 332 are each formed within a respective hole 38a. These bottom electrodes are connected to the upper ends of the polysilicon plug contacts 321 and 322. Capacitor tubular top electrodes 33c are each formed on a capacitor insulation film 33b over the respective tubular bottom electrode 33a. A fourth interlayer insulation film 39 is formed on the capacitor top electrodes 33c. In the logic region 200, the fourth interlayer insulation film 39 is formed directly on the third interlayer insulation film 38. A hole 37a is formed through the silicon nitride film 37 on the polysilicon plug contact 31 in the memory cell region 100, and a barrier metal 40 is formed in the hole 37a. A bit-line plug contact 41 of tungsten or the like is formed through the interlayer insulation films 38 and 39 on the barrier metal 40, and a memory bit line 34 is formed on the plug contact 41 through a barrier metal 42.

In the logic region 200, barrier metals 43B1 and 43B2 are formed on the first silicide films 25B1 and 25B2. The barrier metals 43B1 and 43B2 are formed using the same material as that of the barrier metal 40 when the barrier metal 40 is formed. Bit-line plug contacts 44B1 and 44B2 are formed through the first to the fourth interlayer insulation film 26, 30, 38, and 39. The bit-line plug contacts 44B1 and 44B2 are formed using the same material as that of the plug contact 41 in the memory cell region 100 when the plug contact 41 is formed. The bit lines 35 and 36 in the logic region 200 are formed on the plug contacts 44B1 and 44B2 through barrier metals 45B1 and 45B2. The bit lines 35 and 36 are formed using the same material as that of the bit line 34 in the memory cell region 100 when the bit line 34 is formed.

FIG. 12 shows a pair of access transistors TA1 and TA2 in the memory cell region 100 and one logic transistor TR1 in the logic region 200. The access transistor TA1 has the source 16A1, the drain 17A1, and the gate electrode 13A1, and stores memory charge in the memory capacitor 331. The access transistor TA2, on the other hand, has the source 16A1, the drain 17A2, and the gate electrode 13A2, and stores memory charge in the memory capacitor 332. The gate resistances of the access transistors TA1 and TA2 are reduced by the third silicide films 29A on their gate electrodes 13A1 and 13A2, enabling rapid access operation. Furthermore, the logic transistor TR1 has the sources 18B1 and 23B1, the drains 19B1 and 24B1, and the gate electrode 13B1. The resistances of the source and the drain circuit of the logic transistor TR1 are lowered by the first silicide films 25B1 and 25B2 on the sources and the drains, enabling higher output. Furthermore, the resistance of the gate circuit is reduced by the second silicide film 29B on the gate electrode 13B1, enabling high-speed operation.

Second Embodiment

FIGS. 13 through 18 show a semiconductor memory device according to a second embodiment of the present invention, each figure indicating a step performed in the fabrication process. In the second embodiment, a fourth silicide film is formed on the bit-line polysilicon plug contacts connected to the source of the access transistors in the memory cell region 100 and on the capacitor polysilicon plug contact connected to the drains, reducing the resistance of each corresponding circuit.

The first half of the fabrication process employed by the second embodiment is the same as that of the first embodiment, that is, the first to the sixth process of the first embodiment shown in FIGS. 1 to 6. The second half of the fabrication process of the second embodiment is shown in FIGS. 13 to 18.

Figure 13:
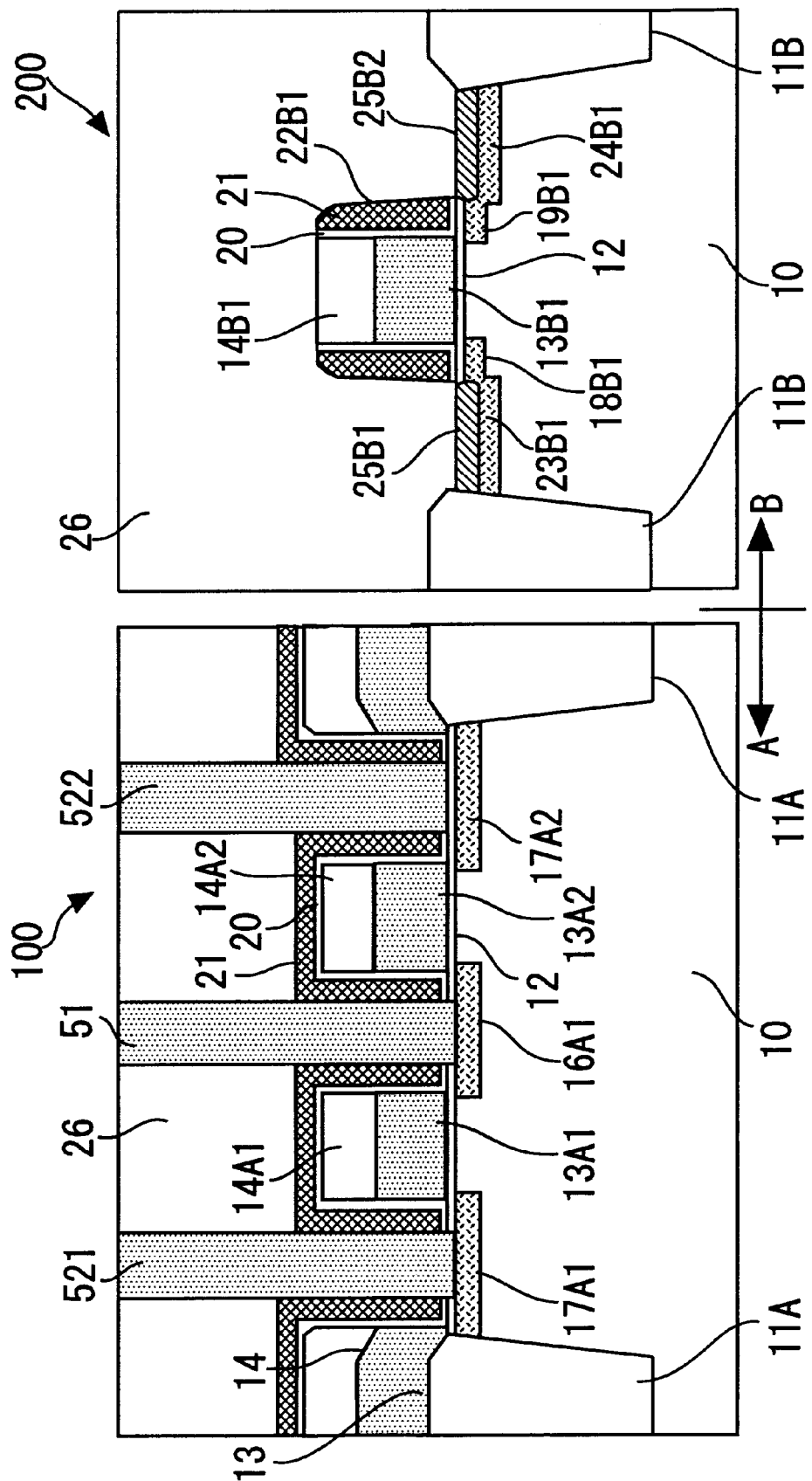
FIG. 13 is a sectional view of a semiconductor memory device in a seventh fabrication process according to a second embodiment of the present invention.

FIG. 13 shows a seventh process of the second embodiment. In the seventh process the first interlayer insulation film 26 is coated on the entire front surface of the silicon substrate 10 before forming polysilicon plug contacts 51, 521, and 522. The polysilicon plug contact 51 is connected to the source 16A1 through the interlayer insulation film 26, and the silicon nitride film 21, the TEOS silicon oxide film 20, and the silicon oxide film 12 on the source 16A1. The polysilicon plug contacts 521 and 522 are connected to the drains 17A1 and 17A2, respectively, through the interlayer insulation film 26, and the silicon nitride film 21, the TEOS silicon oxide film 20, and the silicon oxide film 12 on the drains 17A1 and 17A2.

Figure 14:
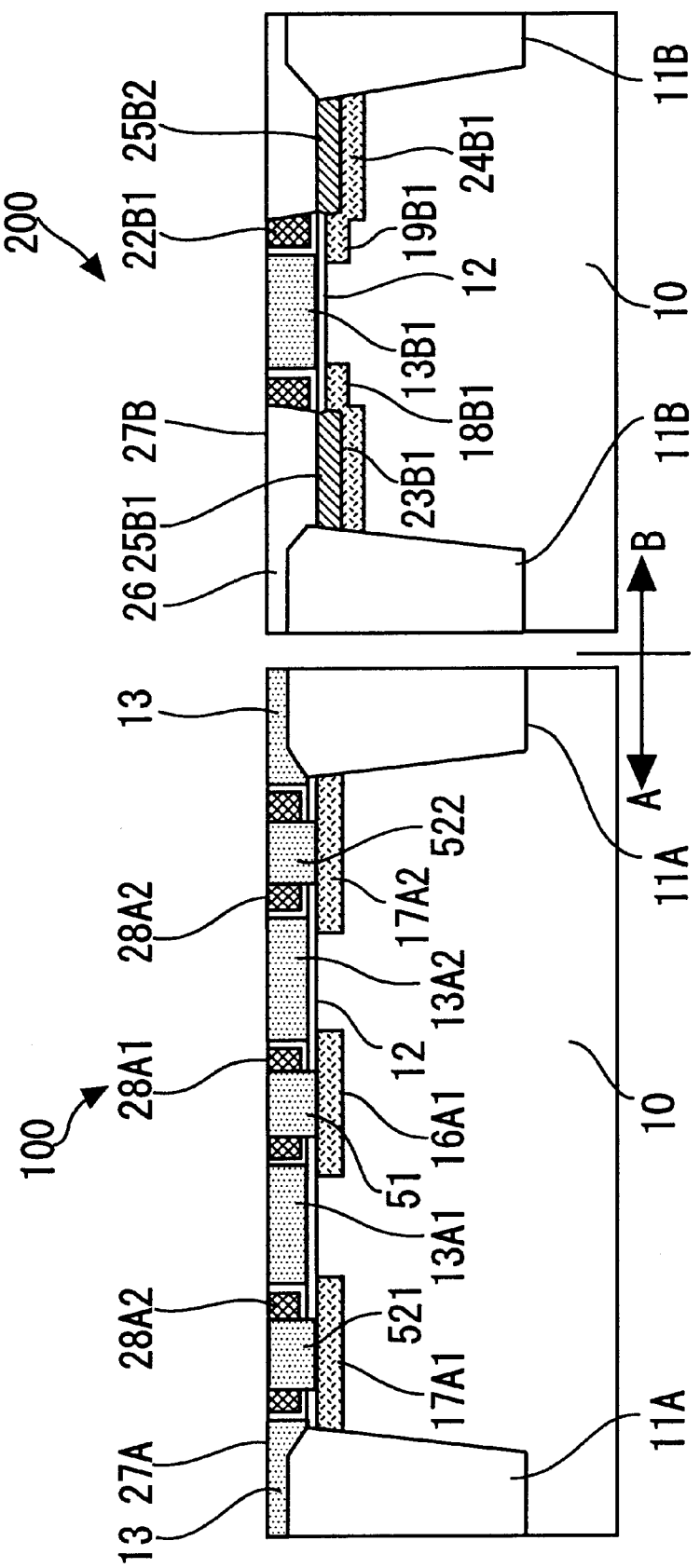
FIG. 14 is a sectional view of a semiconductor memory device in an eighth fabrication process according to the second embodiment of the present invention.

FIG. 14 shows an eighth process of the second embodiment. As in the eighth process of the first embodiment shown in FIG. 8, in the eighth process of the second embodiment, the entire front surface of the silicon substrate 10 is polished by, for example, chemical mechanical polishing. Thus, the polished surfaces 27A and 27B is formed. In the memory cell region 100, the polished surface 27A, together with the gate electrodes 13A1 and 13A2, is formed so as to expose the polysilicon plug contacts 51, 521, and 522. As a result, the polysilicon plug contact 51 penetrates through the laminated insulation film 28A1 on the source 16A1, while the polysilicon plug contacts 521 and 522 penetrates through the laminated insulation film 28A2 on the drains 17A1 and 17A2.

Figure 15:
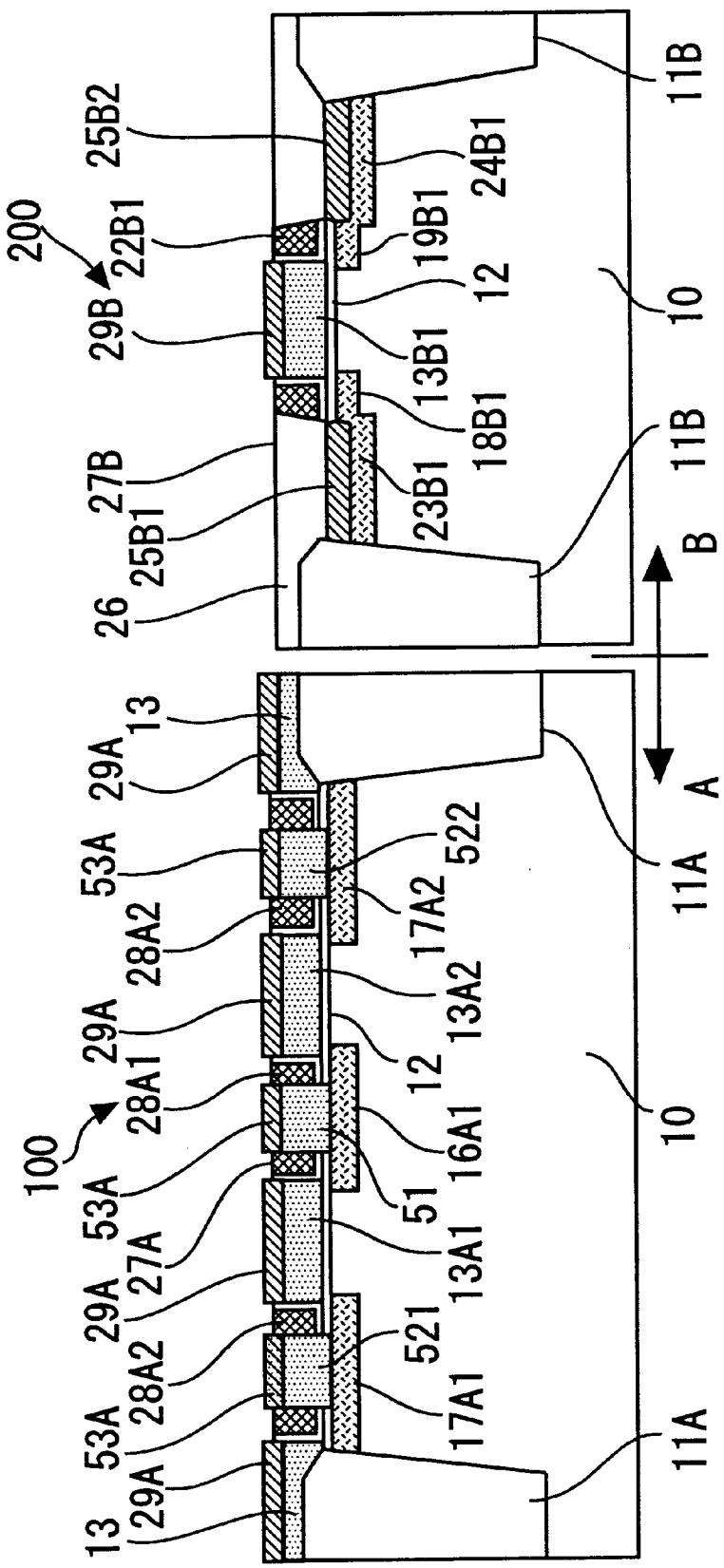
FIG. 15 is a sectional view of a semiconductor memory device in a ninth fabrication process according to the second embodiment of the present invention.

FIG. 15 shows a ninth process of the second embodiment. As in the ninth process of the first embodiment shown in FIG. 9, in the ninth process of the second embodiment, the second silicide film 29B and the third silicide film 29A are formed as well as a fourth silicide film 53A are formed on the polished surface 27A of the polysilicon plug contacts 51, 521, and 522. The fourth silicide film 53A is formed as a metal silicide film using the same material as those of the second silicide film 29B and the third silicide film 29A when the second silicide film 29B and the third silicide film 29A are formed. The polished surface 27A of the laminated insulation films 28A1 and 28A2 is positioned at substantially the same height as those of the silicide films 29A and 53A, and the laminated insulation films 28A1 and 28A2 each have a thickness sufficient to prevent the metals constituting the silicide films from diffusing into the source 16A1 and the drains 17A1 and 17A2.

Figure 16:
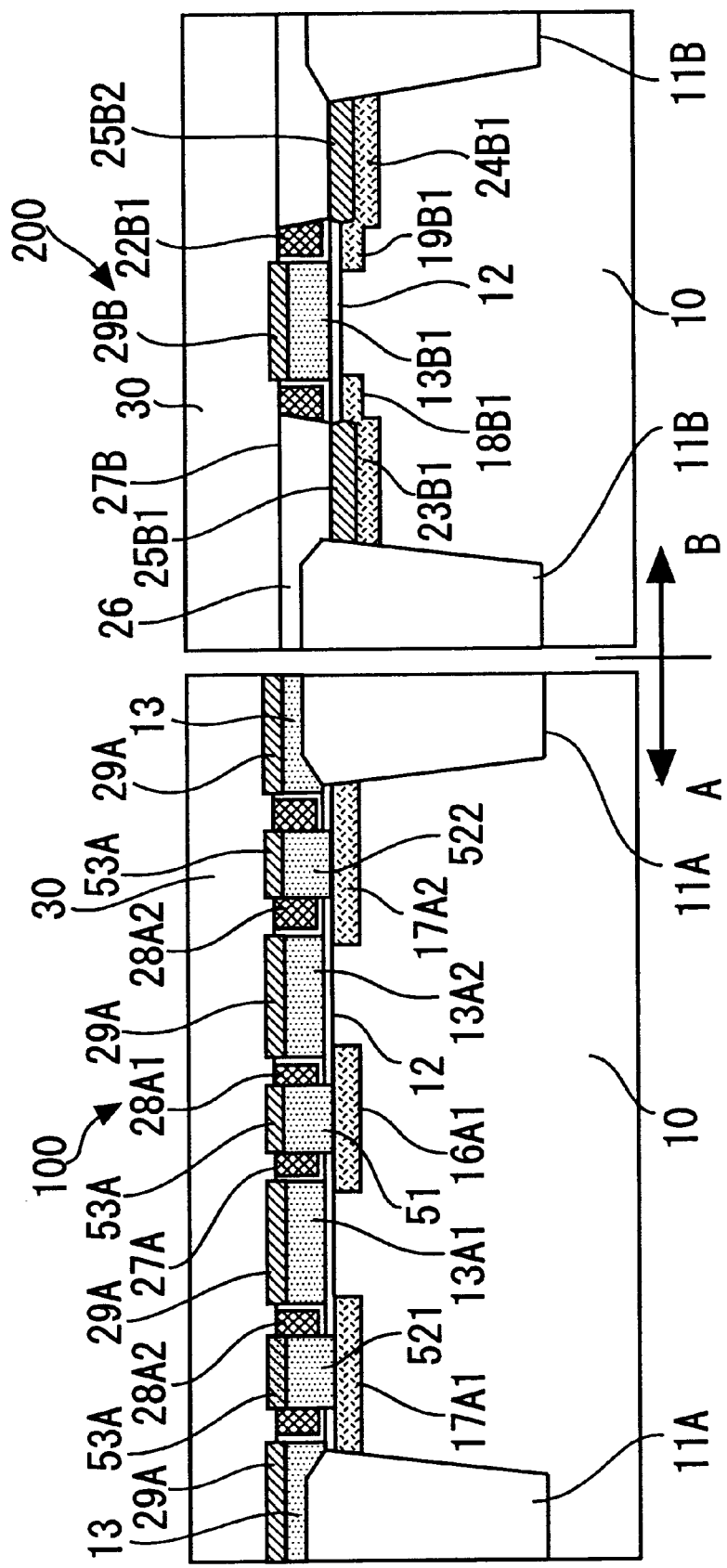
FIG. 16 is a sectional view of a semiconductor memory device in a tenth fabrication process according to the second embodiment of the present invention.

FIG. 16 shows a tenth process of the second embodiment. In the tenth process, the second interlayer insulation film 30 is coated on the entire front surface of the silicon substrate 10.

Figure 17:
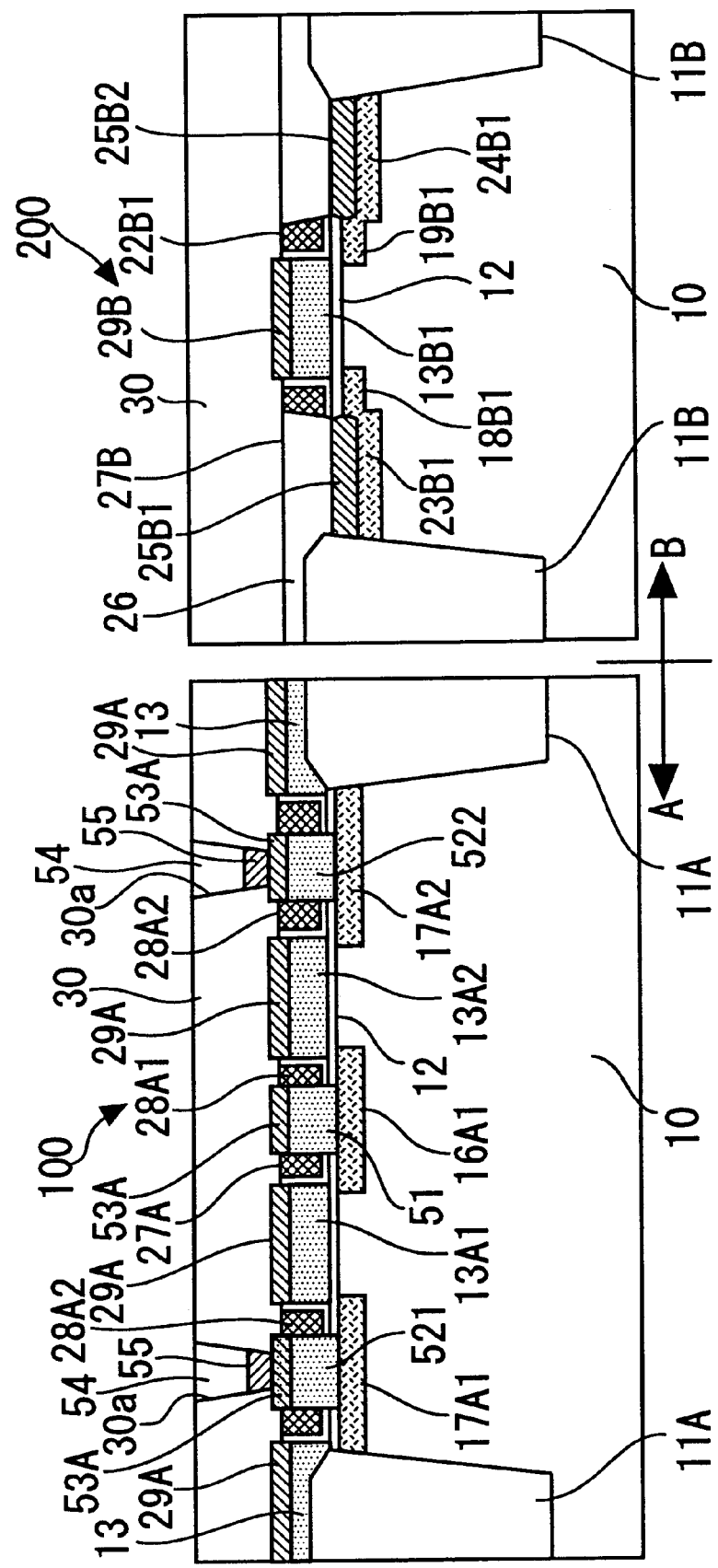
FIG. 17 is a sectional view of a semiconductor memory device in an eleventh fabrication process according to the second embodiment of the present invention.

FIG. 17 shows an eleventh process of the second embodiment. In the eleventh process, capacitor plug contacts 54 of tungsten or the like are formed in the memory cell region 100 as follows. First, holes 30a are formed through the interlayer insulation film 30 over the polysilicon contacts 521 and 522. A capacitor plug contact 54 is formed in each hole 30a after a barrier metal 55 is formed at the bottom of each hole 30a. The capacitor plug contacts 54 are connected to the fourth silicide film 53A on the polysilicon contacts 521 and 522 through the barrier metals 55.

Figure 18:
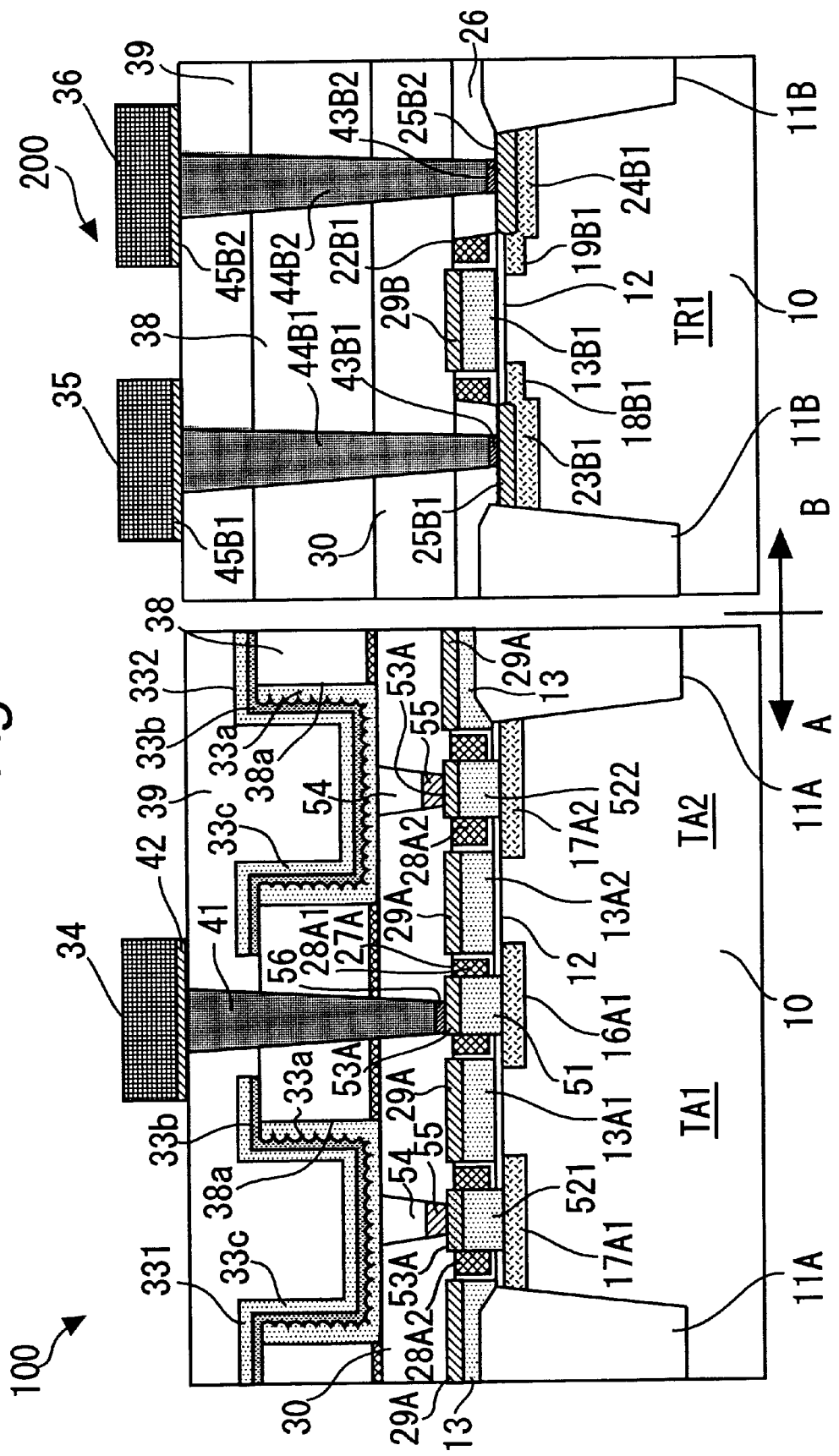
FIG. 18 is a sectional view of a semiconductor memory device in a twelfth fabrication process according to the second embodiment of the present invention.

FIG. 18 shows a twelfth process of the second embodiment. As in the twelfth process of the first embodiment shown in FIG. 12, in the twelfth embodiment of the second embodiment, the memory capacitors 331 and 332 and the bit line 34 are formed in the memory cell region 100 and the bit lines 35 and 36 are formed in the logic region 200. In the second embodiment, the tubular bottom electrodes 33a of the memory capacitors 331 and 332 are each connected to a respective capacitor plug contact 54. The bit line 34 is connected to the source 16A1 through the bit-line plug contact 41. In the second embodiment, the bit-line plug contact 41 is formed in a hole penetrating through the second to the fourth interlayer insulation film 30, 38, and 39. Since a barrier metal 56 formed at the bottom of this hole is connected to the fourth silicide film 53A on the polysilicon plug contact 51, the bit-line plug contact 41 is connected to the polysilicon plug contact 51 through the barrier metal 56.

According to the second embodiment, since the circuit connecting the memory capacitor 331 with the drain 17A1 and the circuit connecting the memory capacitor 332 with the drain 17A2 each include the fourth silicide film 53A and furthermore the circuit connecting the bit line 34 with the source 16A1 also includes the fourth silicide film 53A, it is possible to reduce the resistances of these connecting circuits. This is effective in increasing the speed of memory charge accumulation in the memory capacitors 331 and 332.

Third Embodiment

A third embodiment of the present invention is a variation of the first embodiment. In the third embodiment a fabrication process similar to that of the first embodiment shown in FIGS. 1 through 12 is used. However, in the third embodiment, one type of metals is selected for making up the first silicide films 25B1 and 25B2 on the source 23B1 and the drain 24B1 of the logic transistor TR1 and another type of metals is selected for making up the silicide films 29A and 29B on the gate electrodes 13A1 and 13A2 of the access transistors TA1 and TA2 and on the gate electrode 13B1 of the logic transistor TR1 so that both types are different from each other. As a result, the type of silicide film used as the first silicide films 25B1 and 25B2 is different from that used as the second silicide film 29B and the third silicide film 29A.

The first silicide films 25B1 and 25B2 on the source and the drain of the logic transistor TR1 is formed by using metal materials suitable for minimizing their resistance, while the second silicide film 29B and the third silicide film 29A on the gate electrode of each transistor are formed by using metal materials suitable for optimizing the resistance of the gate circuit for each transistor. These metal materials are selected from a group of metal materials described above so as to minimize the resistance of the source and the drain circuit of the logic transistor and optimize the resistance of the gate circuit for each transistor.

Fourth Embodiment

A fourth embodiment of the present invention is a variation of the second embodiment. In the fourth embodiment, a fabrication process similar to that of the second embodiment shown in FIGS. 1 through 6 and 13 through 18 is used. However, in the fourth embodiment, one type of metals is selected for making up the first silicide films 25B1 and 25B2 on the source 23B1 and the drain 24B1 of the logic transistor TR1 and another type of metals is selected for making up the silicide films 29A and 29B on the gate electrodes 13A1 and 13A2 of the access transistors TA1 and TA2 and on the gate electrode 13B1 of the logic transistor TR1, and the silicide film 53A on the polysilicon plug contacts 51, 521, and 522 so that both types are different from each other. As a result, the type of silicide film used as the first silicide films 25B1 and 25B2 are different from that used as the second silicide film 29B, the third silicide film 29A, and the fourth silicide film 53A.

The first silicide films 25B1 and 25B2 on the source and the drain of the logic transistor TR1 is formed by using metal materials suitable for minimizing their resistance, while the second silicide film 29B and the third silicide film 29A on the gate electrode of each transistor and the fourth silicide film 53A on the polysilicon plug contacts are formed by using metal materials suitable for optimizing the resistance of the gate circuit for each transistor. These metal materials are selected from a group of metal materials described above so as to minimize the resistance of the source and the drain circuit of the logic transistor and optimize the resistance of the gate circuit for each transistor.

The features and advantages of the present invention may be summarized as follows.

According one aspect of the invention, in a semiconductor memory device, the same insulation film as that encircling the sidewall of a logic transistor is laminated on the source and the drains of each access transistor in a memory cell region as a laminated insulation film. Furthermore, the front surface of this laminated insulation film is set to have substantially the same height as that of the third silicide film on the gate electrodes of the access transistors. Accordingly, it is possible to cover the source and the drains of each access transistor with a laminated insulation film of a sufficient thickness even when their areas are large while applying a "sailicide technique" to the logic transistor and a "silicide technique" to the drains of each access transistor, thereby preventing metals from diffusing into the source and the drains of each access transistor to reduce their leakage currents and enhance the refresh performance.

In another aspect of the invention, in the semiconductor memory device, a second and a third silicide film on each gate electrode of the logic and the access transistor are made up of a same material but a first silicide film on the source and the drain of the logic transistor is made up of a different material. Accordingly, it is possible to minimize the resistance of the source and the drain circuit of the logic transistor and optimize the resistance of the gate circuit of each transistor at the same time.

In another aspect of the invention, in the semiconductor memory device, a fourth silicide film is formed on bit-line plug contacts connected to the source of the access transistors and on capacitor plug contacts connected to the drains. Accordingly, it is possible to reduce the resistance of the circuit connecting the bit lines of each access transistor with its source and the resistance of the circuit connecting the memory capacitor with the drains so as to increase the speed of accumulation of memory charge.

In another aspect of the invention, in the semiconductor memory device, the second and the third silicide film on each gate electrode of the logic and the access transistor and the fourth silicide film on bit-line plug contacts are made up of a same material but the first silicide film on the source and the drain of the logic transistor is made up of a different material. Accordingly, it is possible to minimize the resistance of the source and the drain circuit of the logic transistor and optimize the resistance of the gate circuit of each transistor at the same time.

In another aspect of the invention, in the method for fabricating a semiconductor memory device, two insulation films are coated on the source and the drains of each access transistor, forming a laminated insulation film, wherein one of the insulation films is the same as that forming the sidewall of the gate electrode of a logic transistor and the other insulation film is the same as that encircling the sidewall of the logic transistor. Furthermore, the logic region and the memory cell region are polished together so that the gate electrodes of the logic and the access transistors are exposed, and the laminated insulation film on the sources and the drains of the access transistors are also polished. Accordingly, it is possible to prevent metals from diffusing into the source and the drains of the access transistors in the process of forming a second and a third silicide film on the gate electrode of each transistor without making the fabrication process complicated, thereby preventing the leakage currents from increasing in order to enhance the refresh performance.

In another aspect of the invention, in the method for fabricating a semiconductor memory device, the second and the third silicide film on each gate electrode of the logic and the access transistors are made up of a same material but the first silicide film on the source and the drain of the logic transistor is made up of a different material. Accordingly, it is possible to minimize the resistance of the source and the drain circuit of the logic transistor and optimize the resistance of the gate circuit of each transistor at the same time.

In another aspect of the invention, in the method for fabricating a semiconductor memory device, a fourth silicide film is formed on bit-line plug contacts connected to the source of each access transistor and on capacitor plug contacts connected to the drains. Accordingly, it is possible to reduce the resistance of the circuit connecting the bit lines of each access transistor with its source and the resistance of the circuit connecting the memory capacitor with the drains.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-127904, filed on Apr. 25, 2001 including specification, claims, drawings and summary, on which the Convention priority of the present application is based, are incorporated herein by reference in its entirety.

What is claimed is:

1. A semiconductor device comprising:
   a plurality of access transistors and memory capacitors connected to drains of said plurality of access transistors in a memory cell region; and
   a plurality of logic transistors in a logic region;
   said each logic transistor including:
      a first silicide film on a source and a drain;
      a gate electrode on a gate insulation film;
      a second suicide film on said gate electrode;
      a sidewall formed from a first film and proximate said gate electrode; and
      an encircling insulation film formed from a second film and encircling said sidewall; and
   said each access transistor including:
      a gate electrode on a gate insulation film;
      a third silicide film on said gate electrode; and
      a laminated insulation film on a source and a drain of said each access transistor; wherein
         said laminated insulation film is composed of a first layer and a second layer laminated on said first layer and a top surface;
         a top surface of said laminated insulation film is positioned at substantially the same height as a middle of a thickness of said third silicide film,
      said first layer is formed from said first film, which is also used to form said sidewall of said each logic transistor,
      said second layer is formed from said second film, which is also used to form said encircling insulation film.

2. The semiconductor device according to claim 1, wherein said second silicide film and said third silicide film are made of a same material but said first silicide film is made of a different material.

3. The semiconductor device according to claim 1, further comprising:
   a bit-line plug contact connected to one of said source and said drain of said each access transistor and a capacitor plug contact connected to the other of said source and said drain of said each access transistor; said bit-line plug contact and said capacitor plug contact being formed through said laminated insulation film,
   wherein said bit-line plug contact and said capacitor plug contact each have fourth silicide film thereon, and a bit line and a memory capacitor are each connected to a respective fourth silicide.

4. The semiconductor device according to claim 3, wherein said second silicide film, said third silicide film, and said fourth silicide film are made of a same material but said first silicide film is made of a different material.

* * * * *